United States Patent
Trantham et al.

(10) Patent No.: US 11,908,504 B2
(45) Date of Patent: Feb. 20, 2024

(54) FRONT END BUFFER HAVING FERROELECTRIC FIELD EFFECT TRANSISTOR (FEFET) BASED MEMORY

(71) Applicant: Seagate Technology LLC, Fremont, CA (US)

(72) Inventors: Jon D. Trantham, Chanhassen, MN (US); Praveen Viraraghavan, Chicago, IL (US); John W. Dykes, Eden Prairie, MN (US); Ian J. Gilbert, Chanhassen, MN (US); Sangita Shreedharan Kalarickal, Eden Prairie, MN (US); Matthew J. Totin, Excelsior, MN (US); Mohamad El-Batal, Superior, CO (US); Darshana H. Mehta, Shakopee, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 17/719,637

(22) Filed: Apr. 13, 2022

(65) Prior Publication Data
US 2022/0328086 A1    Oct. 13, 2022

Related U.S. Application Data

(60) Provisional application No. 63/201,106, filed on Apr. 13, 2021.

(51) Int. Cl.
*G11C 11/22* (2006.01)
*H10B 51/20* (2023.01)
*H10B 51/30* (2023.01)

(52) U.S. Cl.
CPC ........ *G11C 11/223* (2013.01); *G11C 11/2273* (2013.01); *G11C 11/2275* (2013.01); *H10B 51/20* (2023.02); *H10B 51/30* (2023.02)

(58) Field of Classification Search
CPC ............. G11C 11/223; G11C 11/2273; G11C 11/2275; H10B 51/20; H10B 51/30; H01L 29/40111; H01L 29/516
(Continued)

(56) References Cited

U.S. PATENT DOCUMENTS 7,231,497 B2    6/2007   Trika et al.
8,089,108 B2    1/2012   Wilson et al.
(Continued)

FOREIGN PATENT DOCUMENTS

JP    H11288253 A    * 10/1999
JP    2006139851 A   *  6/2006    ........... G11C 11/406

*Primary Examiner* — Fernando Hidalgo
(74) *Attorney, Agent, or Firm* — HOLZER PATEL DRENNAN

(57) ABSTRACT

A memory device formed of ferroelectric field effect transistors (FeFETs). The memory device can be used as a front end buffer, such as in a data storage device having a non-volatile memory (NVM). A controller can be configured to transfer user data between the NVM and an external client (host) via the buffer. The FeFETs can be arranged in a two-dimensional (2D) or a three-dimensional (3D) array. A monitor circuit can be used to monitor operation of the FeFETs. An optimization controller can be used to adjust at least one operational parameter associated with the FeFETs responsive to the monitored operation by the monitor circuit. The FeFETs may require a refresh operation after each read operation. A power down sequence can involve a read operation without a subsequent refresh operation to wipe the FeFETs, the read operation jettisoning the data read from the buffer memory.

17 Claims, 7 Drawing Sheets

(58) Field of Classification Search
USPC .......................................................... 356/145
See application file for complete search history.

(56) References Cited

U.S. PATENT DOCUMENTS

| | | | |
|---|---|---|---|
| 8,886,911 B2 | 11/2014 | Nemazie et al. | |
| 9,818,848 B2 | 11/2017 | Sun et al. | |
| 10,038,092 B1* | 7/2018 | Chen | H10B 53/20 |
| 10,153,368 B2 | 12/2018 | Hatch et al. | |
| 10,359,933 B2 | 7/2019 | Muchherla et al. | |
| 10,379,782 B2 | 8/2019 | Nagarajan et al. | |
| 10,430,084 B2 | 10/2019 | Goss et al. | |
| 11,086,561 B2* | 8/2021 | Youn | G06F 11/1048 |
| 2019/0244933 A1 | 8/2019 | Or-Bach et al. | |
| 2020/0371873 A1* | 11/2020 | Schaefer | G11C 11/2273 |
| 2021/0233901 A1* | 7/2021 | Or-Bach | H01L 25/18 |
| 2022/0093149 A1* | 3/2022 | Sakuma | H10B 51/10 |
| 2022/0285401 A1* | 9/2022 | Cha | H10B 51/20 |
| 2022/0302170 A1* | 9/2022 | Suzuki | H10B 51/10 |
| 2023/0062718 A1* | 3/2023 | Chen | H10B 51/20 |

* cited by examiner

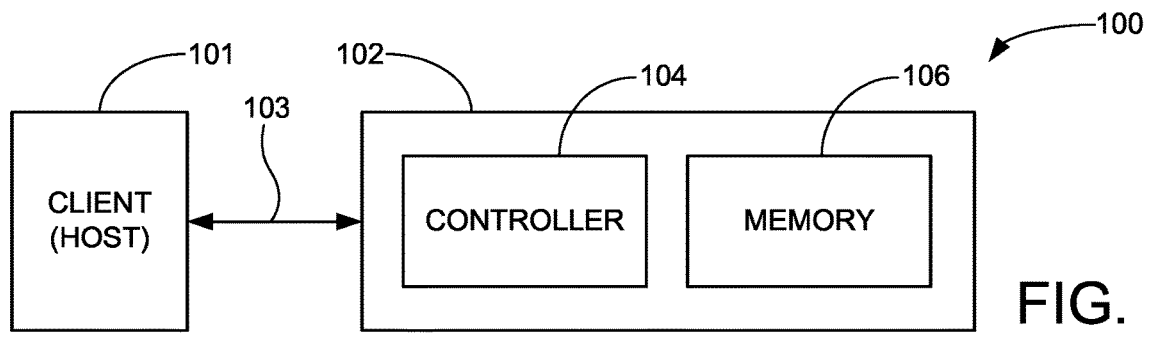
FIG. 1
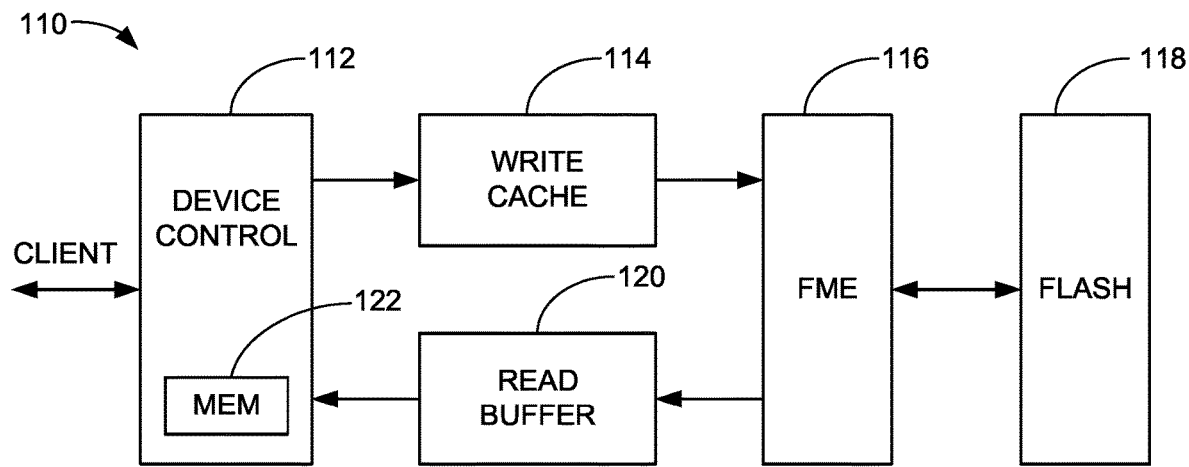
FIG. 2
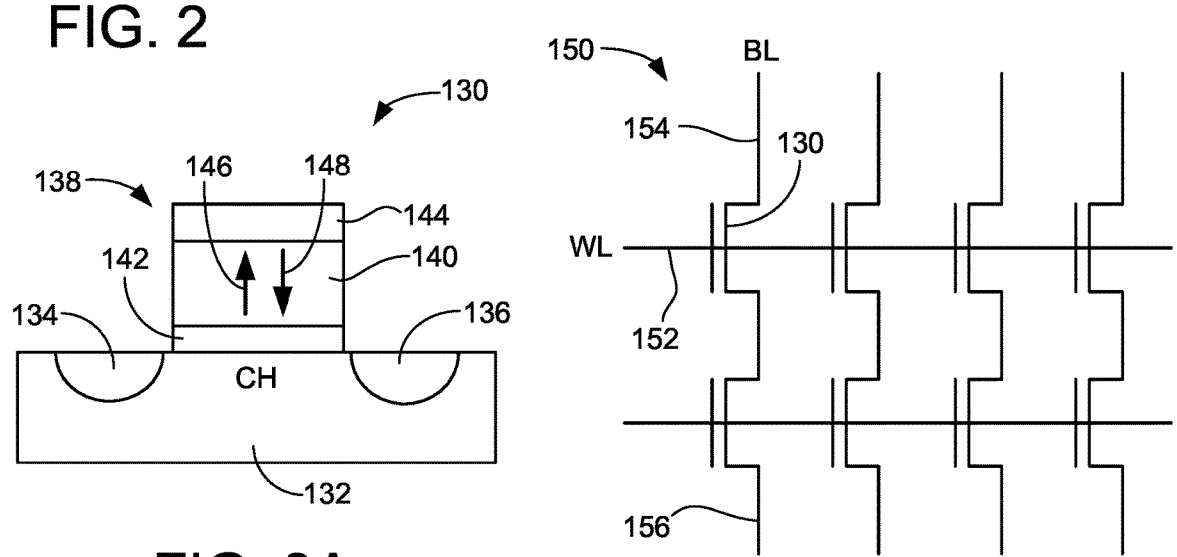
FIG. 3A
FIG. 3B

2D FeFET BUFFER MEMORY

FRONT END BUFFER HAVING FERROELECTRIC FIELD EFFECT TRANSISTOR (FEFET) BASED MEMORY

RELATED APPLICATION

The present application makes a claim of domestic priority under 35 U.S.C. 119(e) to U.S. Provisional Patent Application No. 63/201,106 filed Apr. 13, 2021, the contents of which are hereby incorporated by reference.

SUMMARY

Various embodiments of the present disclosure are generally directed to a memory device formed of ferroelectric field effect transistors (FeFETs). The memory device can be utilized as a front end buffer in a data storage device, such as a solid-state drive (SSD).

In some embodiments, a data storage device has a non-volatile memory (NVM) arranged as a main store for user data, such as a flash memory. A controller is configured to transfer the user data between the NVM and an external client (host). A buffer memory formed of FeFETs provides a temporary storage location to store the user data and control information during said transfers by the controller. The buffer memory can be alternatively arranged as a write cache, a read buffer or internal embedded controller memory. The FeFETs can be arranged in a two-dimensional (2D) or a three-dimensional (3D) array. Monitoring and optimization circuitry can be incorporated to optimize performance of the buffer.

In other related embodiments, an apparatus includes a buffer memory formed of ferroelectric field effect transistors (FeFETs). A program driver is configured to write data to the FeFETs to store an existing pattern to the FeFETs. A read driver is configured to read data from the FeFETs to read the existing pattern from the FeFETs. A refresh circuit is configured to selectively rewrite the existing data pattern back to the FeFETs after a read operation carried out by the read driver. A sense circuit is configured to sense the existing pattern stored to the FeFETs. A monitor circuit is configured to monitor operation of the FeFETs. An optimization controller is configured to adjust at least one operational parameter associated with the FeFETs responsive to the monitored operation by the monitor circuit.

These and other features and advantages of various embodiments can be understood from a review of the following detailed description in conjunction with the accompanying drawings.

BRIEF DESCRIPTION OF DRAWINGS

FIG. 1 is a functional block diagram of a data processing system constructed and operated in accordance with various embodiments.

FIG. 2 is a functional block representation of the data storage device of FIG. 1 characterized as a solid-state drive (SSD) in some embodiments.

FIG. 3A depicts a ferroelectric field effect transistor (FeFET) constructed and operated in accordance with some embodiments.

FIG. 3B shows an array of FeFETs from FIG. 3.

DETAILED DISCUSSION

Figure 4A:
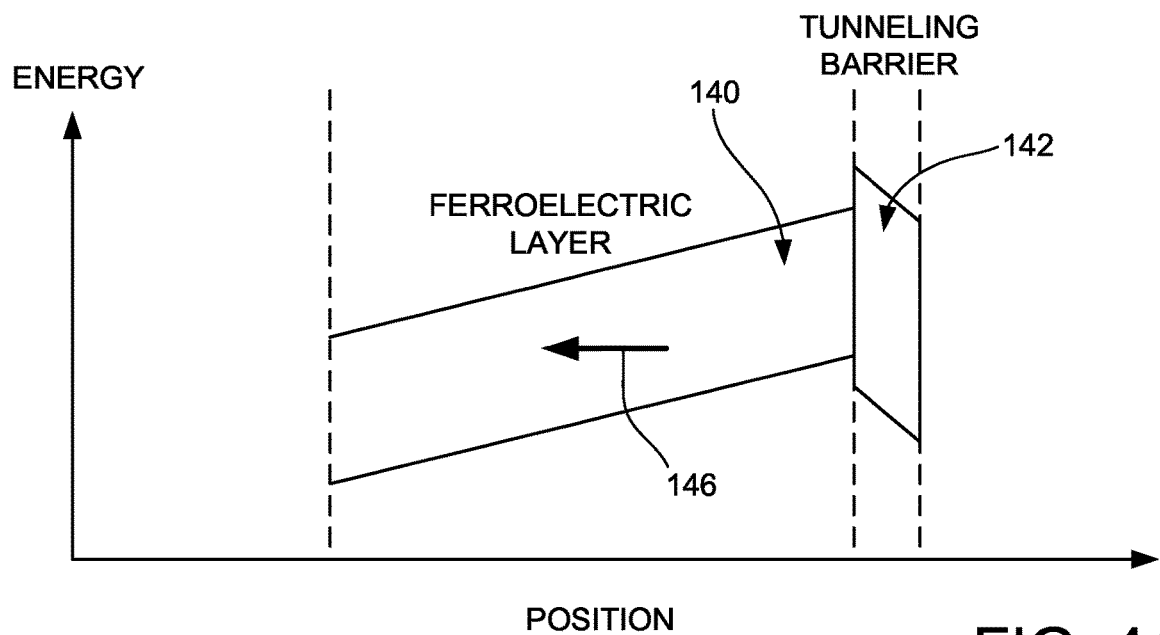
FIGS. 4A and 4B are graphical depictions of band diagrams to illustrate exemplary operation of the FeFETs from FIG. 3B.

Various embodiments of the present disclosure are generally directed to systems and methods for arranging and using ferroelectric memory elements to form a fast response, high density buffer memory. The memory is useful in various environments, including as a front end buffer for a data storage device.

Ferroelectric field effect transistors (FeFETs) are transistor-based memory elements that provide non-volatile storage with fast response and low power consumption characteristics. The elements (transistors) are usually configured with respective drain, source and gate regions which are interconnected with corresponding bit, source and word lines. The gate regions incorporate one or more ferroelectric layers to store data bits responsive to the electrical polarization of the ferroelectric layers. While it is common to utilize a single FeFET per memory cell, some memory cell configurations can incorporate multiple FeFETs per memory cell.

FeFETs have been found to combine the non-volatile memory (NVM) and density advantages of flash memory with the speed and rewritable capabilities of volatile memory DRAM. FeFETs provide very fast read and write speeds (often on the order of a few nanoseconds, ns), which are comparable to those achievable with DRAM cells. Like DRAM, FeFETs are rewritable in place so that new data can be overwritten without the need for an intervening erasure operation FeFETs are different from DRAM, however, since DRAM cells use a separate capacitor whereas FeFETs do not. DRAM requires each cell to have both at least one transistor and at least one capacitor. The accumulated charge storage state of the capacitor (or capacitors) establishes the storage state of the cell. Commonly employed DRAM configurations can include 1T1C (one transistor, one capacitor), 2T2C, 1T4C, 6T4C, etc.

By contrast, FeFETs do not require a separate capacitor. Instead, FeFETs place the ferroelectric layer within the gate structure of the transistor itself. In this way, the ferroelectric layer is similar to the isolated floating gates used in flash memory cells. The fact that FeFETs do not require the use of one or more separate capacitors can lead to significant performance and density improvement opportunities, since scaling and architectures commonly employed for flash memory can be applied to FeFET based memory as well, including the ability to arrange FeFETs into three-dimensional (3D) structures. A corresponding advantage is that, as a rule, FeFETs are usually not read destructive; that is, DRAMs are usually read destructive in that a read operation removes the charge from the capacitor, so that a read operation upon a DRAM requires a followup write operation to replace the data that was previously stored. In most cases, FeFETs are more like flash memory in that a read operation does not require a followup write operation to refresh the stored state.

Various embodiments of the present disclosure are generally directed to a memory configuration that incorporates FeFETs into memory cells to form a memory buffer that can support high speed data transfer operations. As explained below, some embodiments present a front end buffer circuit suitable for use in a data storage environment, such as a write cache, a read buffer or internal processor memory of a solid-state drive (SSD). Other forms and arrangements can be used.

One arrangement provides a data storage device in the form of a solid-state drive (SSD). Other forms of data storage devices can be used. The SSD includes a non-volatile memory (NVM) arranged as a main store for user data and formed of flash memory. However, other forms of memory for the data storage device can be used, including FeFETs, MRAM, RRAM, STRAM, PCRAM, rotatable disc memory, etc.

A controller circuit is configured to transfer the user data between the NVM and an external client (host). A front end buffer memory is formed of ferroelectric field effect transistors (FeFETs) arranged into a two-dimensional (2D) or three-dimensional (3D) array. The front end buffer memory is operated as a temporary storage location to store the user data and control information during said transfers by the controller.

In some cases, the buffer memory is an external device separate from the controller. In other cases, the buffer memory may be incorporated into an integrated circuit package that includes the controller, such as in a system on chip (SOC) device. Monitoring circuitry can be used to monitor operation of the FeFET memory.

Optimization circuitry can adjust various parameters of the memory to adaptively tailor the operation of the memory to the current and future expected environment. In yet further cases, the characteristics of FeFETs can be used during certain operational modes of the data storage device, such as during a power down (deinitialization) sequence.

These and other features and advantages of various embodiments can be understood beginning with a review of FIG. 1 which provides a data processing system 100. It will be understood that FIG. 1 has been arranged to provide an example environment, so that other operational environments can be used as desired.

The system 100 includes a client (host) device 101 that communicates with a data storage device 102 via an interface 103. The client device 101 may take the form of a personal computer, a smart phone, a workstation, a tablet, a laptop, a gaming system, a microcontroller, a server, an edge device, an Internet of Things (IoT) device, a mass storage array, etc.

The data storage device 102 is configured to store and retrieve data utilized by the user of the client device 101 and may be a local processor memory, a data cache, a server cache, a RAID storage system, a cloud storage system, a solid-state drive (SSD), a hard disc drive (HDD), a hybrid storage device, an array of storage devices, a portable thumb (e.g., USB) drive, etc. The interface 103 can take substantially any form including but not limited to a local wired or wireless interface, a local area network (LAN), a wide area network (WAN), a cloud computing interface, the Internet, etc. Substantially any useful interface protocol can be implemented for the interface 103 including Ethernet, USB, SCSI, SAS, Fibre Channel, PCMI, wireless connections, etc.

Of interest is the data storage device 102, which is shown to include a controller 104 and a memory 106. The controller 104 can include one or more programmable processors that execute program instructions stored in a local memory to carry out various functions, including the control of data transfers between the memory 106 and the client 101 across the interface 103. Additionally or alternatively, the controller 104 can utilize a hardware circuitry such as formed of ASCI (application specific integrated circuits), FPGA (field programmable gate arrays), state machines, or other arrangements of gate logic.

The memory 106 can include any number of useful forms including local memory for the controller, cache memory, buffer, main storage, etc. The memory 106 includes non-volatile memory (NVM), which will be understood, consistent with the customary usage of this term, as persistent memory that continues to retain information stored therein even after the removal of applied power to the memory. The form of the main data store can take any number of forms, including semiconductor based memory, rotatable data storage memory, tape based memory, etc.

FIG. 2 depicts aspects of a data storage device 110 that corresponds to the data storage device 102 of FIG. 1 in some embodiments. In FIG. 2, the data storage device 110 is characterized as a solid-state drive (SSD) that utilizes flash memory as a main memory store. This is not limiting, as any number of other forms of data storage devices can be utilized, including but not limited to hard disc drives (HDDs), hybrid drives, tape drives, optical drives, magneto-optical (MO) drives, etc.

The SSD 110 includes a device controller 112 that corresponds to the controller 104 in FIG. 1. A write cache 114 is an internal buffer memory that temporarily stores sets of write data provided from the external host prior to transfer to the main store. These sets of write data may accompany a write command from the requesting client to store the data for future use.

A flash memory electronics (FME) circuit 116 receives and processes the sets of write data for transfer to a flash array 118. A read buffer 120 temporarily stores corresponding sets of read back data retrieved from the flash array 118, via the FME 116, in response to a read command. The read back data are subsequently transferred from the read buffer 120 to the requesting client that issued the read command. Internal controller memory (MEM) 122 may store program instructions, data queues, command queues, map data, and other forms of control data to facilitate these operations.

FIG. 3A depicts a simplified schematic representation of a FeFET 130 that may be incorporated into the SSD 110 of FIG. 2. FIG. 3A, as well as the other drawings in the present disclosure, are not necessarily drawn to scale. The FeFET 130 may be used as a memory cell (or a portion thereof) in any of the respective memory elements utilized by the controller, including the write cache 114, the read buffer 120 and/or the internal memory 122. The FeFET can additionally or alternatively be incorporated into other aspects of the SSD 110, including but not limited to the FME 116, the flash array 118 (including in conjunction with or as a substitute for the respective flash memory cells in the array), etc.

The FeFET 130 take a generalized field effect transistor configuration and includes a semiconductor substrate 132 with respectively doped source 134 and drain 136 regions. An intervening channel region (CH) extends therebetween adjacent a gate structure 138. The substrate 132 is p doped and the source and drain regions 134, 136 are n doped, although other configurations can be used.

The gate structure 138 includes an intermediate ferroelectric layer 140 sandwiched between a lower interlayer 142 and an upper electrically conductive electrode layer 144. Other arrangements can be used, including arrangements that swap the relative orientations of the ferroelectric layer 140 and the interlayer 142, arrangements that include additional layers, and so on.

The FeFET 130 stores information in relation to the direction of the electric polarization of the ferroelectric material that makes up layer 140. Vertical polarization is shown in FIG. 3A by the respective arrows 146, 148, although other polarization forms and directions can be used. The ferroelectric layer 140 can be polarized in the direction of arrow 146, in the direction of 148, or in a non-polarized state.

While the FeFET 130 is configured to store a single bit, multiple bits can be stored using various mechanisms such as through the use of different polarization magnitudes, similar to the manner in which a multi-level flash memory cell operations with different quantums of accumulated charge. In further embodiments, multiple FeFETs can be arranged in each memory cell to store less than a full bit of data (e.g., two FeFETs each storing 0.5 bits of data, etc.).

A number of different ferroelectric materials can be used to form the ferroelectric layer 140. One suitable material is hafnium oxide (HfO2), which can retain ferroelectricity in film thicknesses under 10 nm, can be deposited conformally via atomic layer deposition, and enables fabrication in a number of different high-density two-dimensional (2D) and three-dimensional (3D) memory architectures such as described below.

Other examples include ZrO2 or Hf1-xZxO2, combinations or alloys of these, as well as other ferroelectric materials. These various materials may be doped with other elements, e.g., Si, Ge, Al, Ti, Sc, Y, La, Ce, Gd, Nb, Sr, Ba, N, etc., for improved ferroelectric properties. Anti-ferroelectric materials, such as ZrO2, can also be used for the ferroelectric layer. As such, reference to ferroelectric materials includes the use of anti-ferroelectric materials unless specified otherwise.

The tunneling layer 142 is a non-ferroelectric material and serves as a tunnel barrier to enhance operation of the ferroelectric layer 140. The tunneling layer may be dielectric, but such is not necessarily required. Suitable materials for the tunneling layer include but are not limited to Al2O3, MgO, SrTiO3, etc. The electrode 144 of the gate structure 138 can be any suitable conductive material, including metals, conductive ceramics, etc. Examples for the electrode 144 can include, but are not limited to, TiN, TaN, Pt, Ag, CrRu, CrMo, CrW, CrTi, and RuAl.

FIG. 3B is a schematic depiction of an array 150 of FeFETs 130 from FIG. 3A arranged in some embodiments. The FeFETs are laid out into rows and columns into a 2D (two-dimensional) layer. Multiple layers can be arranged to provide a 3D (three-dimensional) stack. In FIG. 3B, each row has a word line (WL) 152 that interconnects the electrode layer 144 of each of the FeFETs along the associated row. Bit lines (BL) 154 and source lines (SL) 156 interconnect columns of the respective FeFETs 130 along source/drain portions of the FeFETs.

Figure 4B:
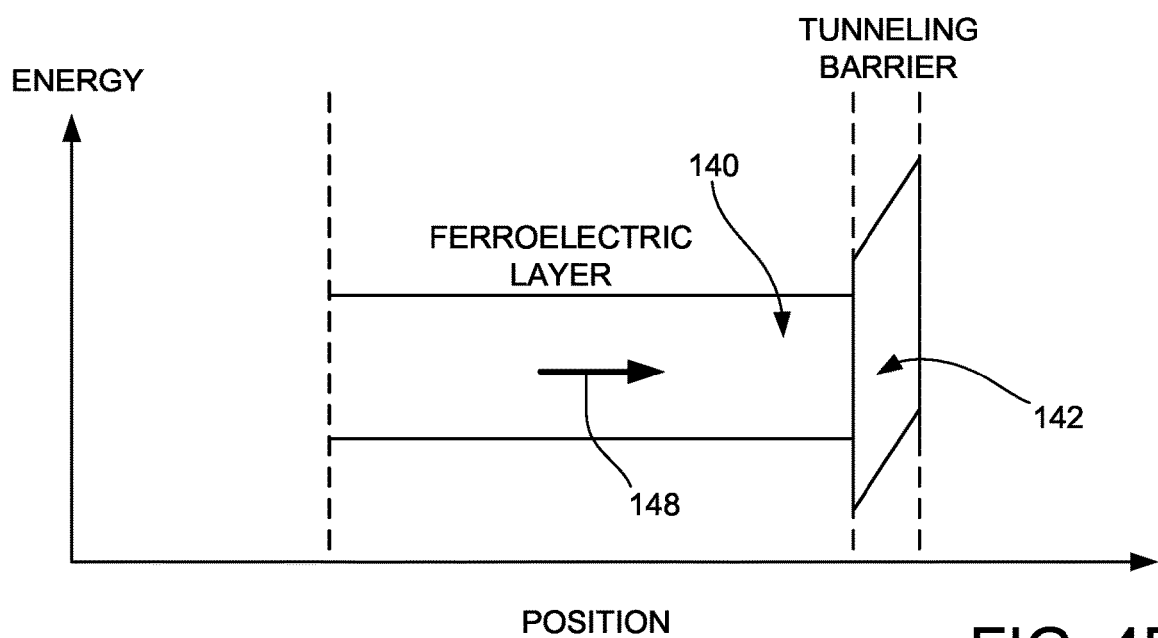

FIGS. 4A and 4B show graphical representations of the operation of the FeFETs 130 in FIG. 3B in some embodiments. The diagrams represent activation energy required across the junction established by the ferroelectric layer 140 and the tunneling barrier 142 within the gate structure 138. In FIG. 4A, the programmed state of the ferroelectric layer 140 is provided in the direction indicated by arrow 146 in FIG. 3A; in FIG. 4B, the programmed state of the ferroelectric layer is provided in the direction indicated by arrow 148 in FIG. 3A.

As can be seen from these respective figures, greater energy is required to establish electrical flow through the junction having the polarization of FIG. 4A as compared to FIG. 4B. Referring again to FIG. 3B, the programmed polarization of the ferroelectric layer 140 (e.g., arrows 146, 148) can be sensed responsive to the current draw (e.g., effective electrical resistance to current flow) through the junction from the BL 154 to the SL 156 by application of a suitable voltage to the WL 152 to activate the FeFET 130. Thus, read sensing operations can be carried out across the ferroelectric layer/tunneling barrier junction to determine the programmed polarization state of the element.

Figure 5:
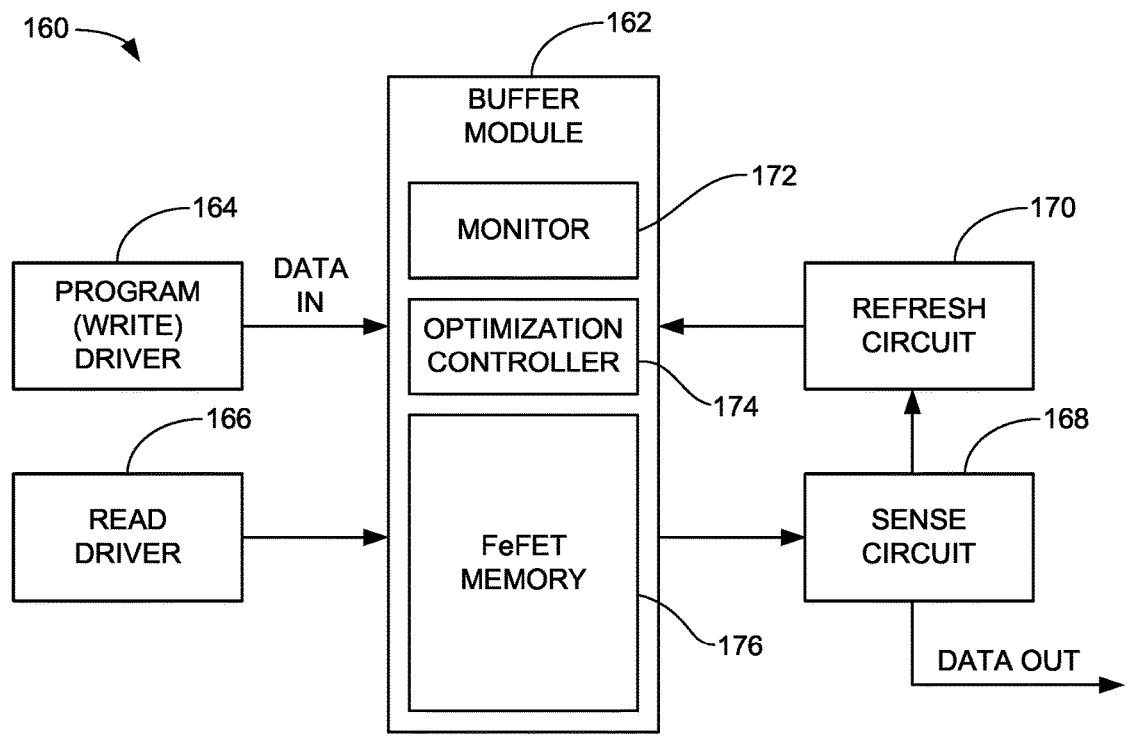
FIG. 5 is a functional block diagram of a front end buffer circuit constructed and operated in accordance with some embodiments.

FIG. 5 is a diagrammatical representation of a front end buffer circuit 160 constructed and operated in accordance with some embodiments. Without limitation, the circuit 160 can be incorporated into the SSD 110 of FIG. 2 as described above, including but not limited to as at least a portion of the write cache 114, the read buffer 120, the embedded controller memory 122, or some other aspect of the SSD. It will be understood, however, that aspects of FIG. 5 can be incorporated into other environments and applications as desired.

The circuit 160 includes a buffer module 162, a program (write) driver circuit 164, a read driver circuit 166, a sense circuit 168 and a refresh circuit 170. The buffer module 162 includes a monitor 172, an optimization controller 174, and a block of FeFET memory 176. Other arrangements can be used. The FeFET memory 176 is made up of FeFETs 130 as generally arranged in FIG. 3B (including in 2D or 3D configurations) to store data bits within the buffer memory 160.

The program driver 164 is utilized to write (program) data to the respective memory cells of the FeFETs 130 in the buffer memory 176. This can include the presentation of appropriate voltages and/or currents on the respective BL, SL and WL control lines 152, 154, 156 to place the associated ferroelectric layers 140 in the desired programmed orientations. Such write operations may arise as a result of an external write command from an external client. Write operations can also arise as a result of an internal write command resulting from an internal background process initiated by the device controller 112.

The read driver 166 places appropriate voltages and/or currents on the respective control lines to enable the sense circuit 168 to sense the programmed orientations of the respective FeFETs, such as during a read operation commanded by an external client or during an internal background read process.

The refresh circuit 170 operates to refresh the current programmed states (orientations of the ferroelectric layers) of the FeFET memory cells in the FeFET memory 176 at appropriate times. In some cases, the refresh circuit 170 operates at the conclusion of each read operation, since a read operation destroys the currently stored state. In this situation, once data are read from a selected location in the FeFETs, the refresh circuit 170 buffers and rewrites the previously stored data back to that selected location from which the data retrieved (as is commonly performed with DRAM). This may require participation by the write driver circuitry 164 to carry out this refresh operation. Other refresh operations may be carried out as well as part of the background processing applied to the buffer module 162.

The monitor circuit 172 operates to monitor operation of the elements in the circuit 160. This monitoring can take a number of forms, including measurements of bit error rates (BER) experienced during data transfers, aging of data, utilization of data blocks and/or memory locations, and other control states associated with the utilization of the buffer. The optimization controller 174 uses the data accumulated by the monitor circuit 172 to implement changes in various control parameters utilized by these elements, so that the optimization controller 174 adaptively adjusts the operation of the circuit 160. Operation of the monitor and the optimization controller is discussed more fully below.

From FIG. 5 it can be seen that the program driver 164 can operate to write (store) a desired data pattern to the FeFETs in the FeFET memory 176, the read driver 166 can operate to read the existing data pattern from the FeFETs, the sense circuit 168 can operate to sense the existing data pattern in the FeFETs, and as desired, the refresh circuit 170 can selectively refresh (rewrite) the existing data pattern back to the FeFETs.

A number of different architectures are contemplated for the FeFET memory 176 of the buffer module 162, and these different architectures will now be described using FIGS. 6-10. It will be appreciated that these architectures are merely illustrative and are not limiting to the scope of the present disclosure.

Figure 6:
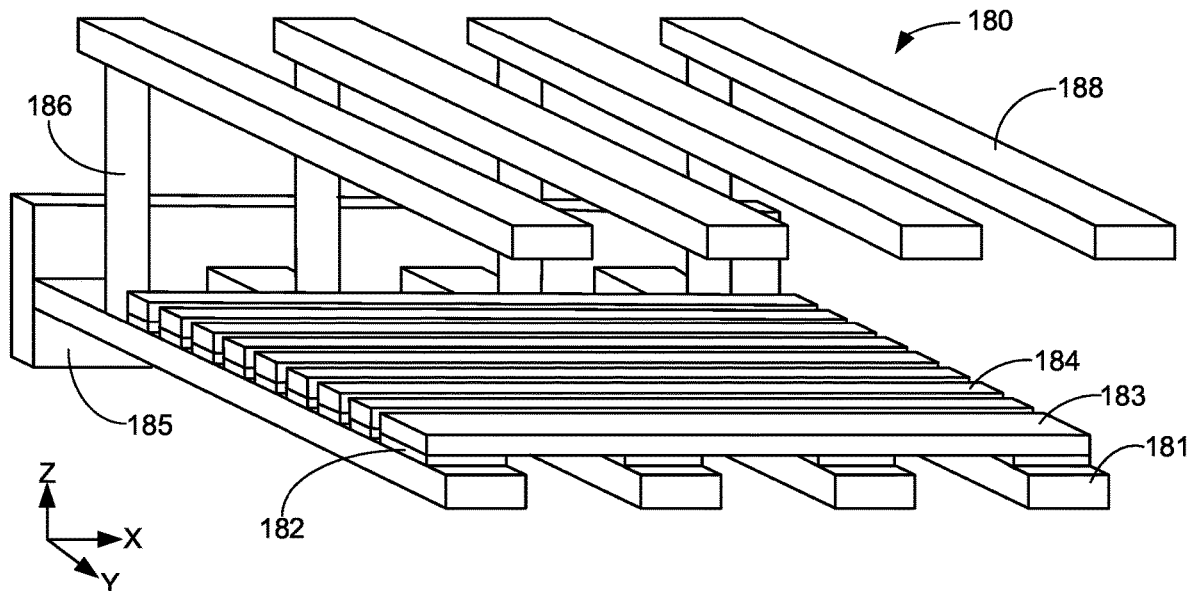
FIG. 6 is a two-dimensional (2D) isometric depiction of a FeFET memory suitable for use in the circuitry of FIG. 5 in some embodiments.

FIG. 6 provides an isometric depiction of the memory 176 arranged as a 2D FeFET buffer memory 180. In this arrangement, The FeFETs are arranged in a manner similar to a conventional NAND flash 2D arrangement. It will be appreciated that other arrangements can be used, so the configuration of FIG. 6 is merely exemplary and is not limiting.

The memory 180 includes channel arrays 181 that extend along the y-axis and which are intersected by insulative trap layers 182. Strips 183 form selection logic transistors and strips 184 form individual FeFETs of the array, each of which extend along the x-axis. Word lines WL (not separately shown) are arranged along the FeFETs in a desired direction.

A vertically extending (z-axis) source line (SL) is shown at 185. Bitline contacts are depicted at 186, and these interconnect an array of bit lines (BLs) 188 which extend along the y-axis. As noted, other arrangements can be used, but it will be appreciated that substantially any existing or future 2D flash memory arrangement (including NOR and NAND flash) can be adapted for use as a 2D array of the FeFETs in various embodiments. Space is provided between the control lines 183/184 and 188 for purposes of clarity of illustration.

It will be noted that other 2D configurations can be utilized, including arrangements that have the control lines arranged in any number of different planes, spacings and directions as required. Substantially any existing or future arrangement used for 2D flash can be adapted for use in a 2D FeFET array, and as such, these are included within the scope of the present disclosure.

Figure 7:
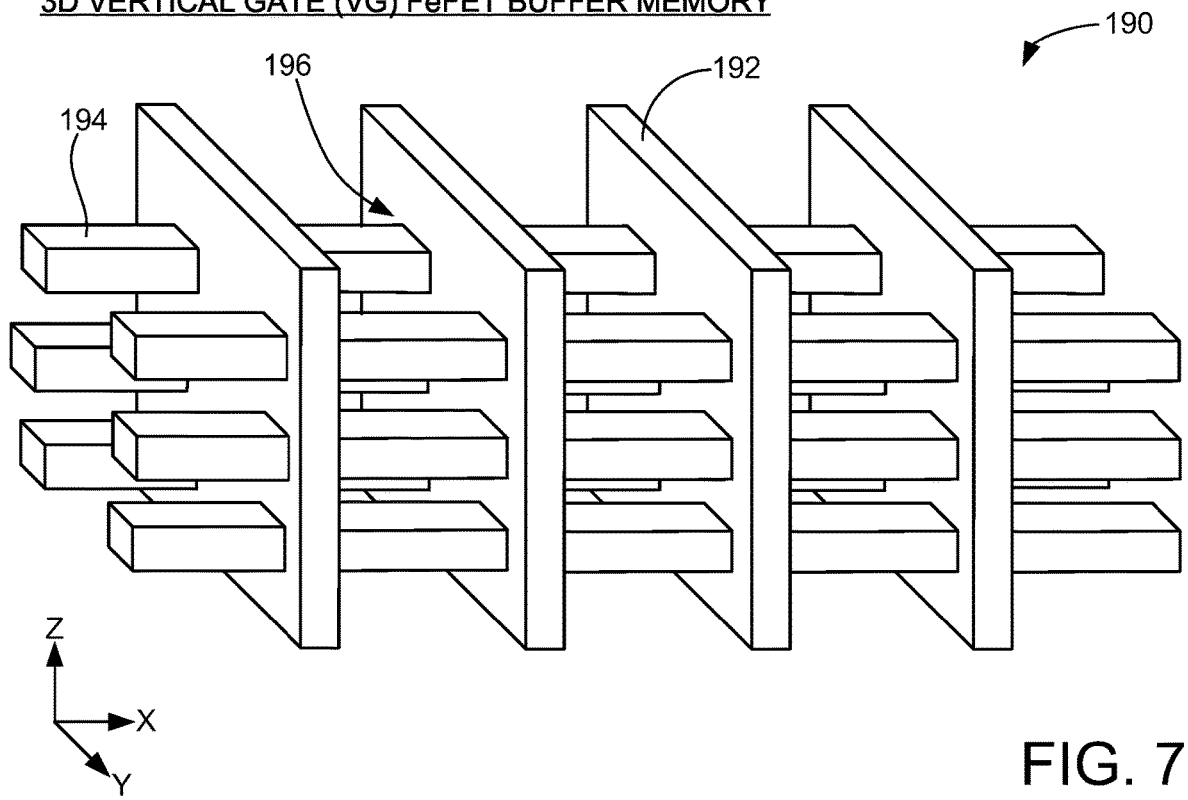
FIG. 7 is a three-dimensional (3D) isometric depiction of a vertical gate (VG) NAND FeFET memory in accordance with some embodiments.
Figure 8:
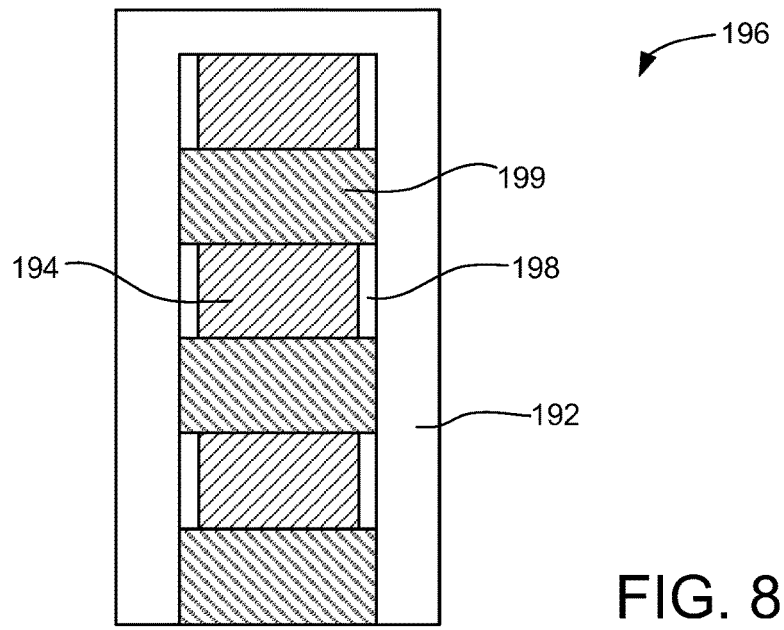
FIG. 8 is a cross-sectional representation of a selected FeFET from FIG. 7.

FIG. 7 is an isometric representation of a portion of a 3D vertical gate (VG) NAND FeFET memory 190 in accordance with some embodiments. This embodiment utilizes FeFETs arranged in a three-dimensional vertical-gate NAND architecture. FIG. 8 shows a cross-section of a selected one of the FeFETs depicted in FIG. 7.

Vertically extending layers 192 represent gate structures (vertical gates, or VGs). Horizontally extending layers 194 represent active layers. FeFETs 196 are arranged at each intersection of a corresponding pair of vertical and horizontal layers 192, 194. It will be noted that the FeFETs 196 are arranged in a 3D spaced apart relation along multiple orthogonal axes (e.g., axes x, y and z as shown). This same relation is provided for each of the embodiments to follow below.

One FeFET 196 from FIG. 7 is depicted in the cross-sectional view of FIG. 8. Composite elements shown in FIG. 8 include a portion of the associated vertical gate 192, a portion of active layer 194, a ferroelectric layer 198, and an insulating spacing layer 199.

3D VG NAND structures such as 190 can be fabricated using fabrication methods that are currently used to form charge-trapping (ONO) flash memory cells (with the changes described herein to provide FeFET based memory arrays). An example fabrication process can be described as follows.

First, CMOS peripheral circuitry (switches, decoders, sense amps, etc.) are fabricated on an underlying substrate (wafer). Alternating, repeating layers of a doped semiconducting material such as p-doped polysilicon and an insulating material such as silicon oxide are deposited. Next, vertical trenches are etched through all the layers. At this point, for conventional 3D VG NAND with charge trapping memory cells, charge trapping layers (e.g., ONO) are conformally deposited on the side walls of the trenches and appropriate select transistors are formed at the ends of the strings via ion implantation or similar process.

A conducting material, e.g., doped polysilicon, is deposited in the trenches and patterned into word line planes perpendicular to the trenches defining the horizontal channels. In this embodiment, instead of a charge trapping layer, a ferroelectric layer, e.g. an 8 nm film of Hf0.5Zr0.5O2 is deposited. This is followed by deposition of an appropriate material, e.g., TiN, to promote development of ferroelectric orthorhombic Hf0.5Zr0.5O2, which is then patterned into word line planes.

Programming is accomplished by applying a positive programming pulse (e.g., +10V) to the word line of the selected cell while holding the channel at 0 V. A smaller inhibit voltage (e.g., +5 V) may be applied to the active layers of bits sharing the same word line so that they are not disturbed by the program operation.

Erasing is accomplished by applying an electric field of opposite polarity, e.g., +10 V to the channel while grounding the word line, or −10 V to the word line while grounding the channel. Again, appropriate inhibit voltages must be applied to the other transistors sharing the same word line so that they are not disturbed by the erase operation.

A cell is read by applying a small pass voltage (e.g., 3 V) to all the transistors sharing an active layer with the transistor to be read (e.g., pass voltage is applied to the rest of the NAND string), and the resulting cell current is measured while the gate voltage of the transistor of interest is swept. The gate voltage at which the transistor turns on may be identified by sense amplifiers and other CMOS peripheral circuitry and can be compared either to a single threshold for SLC operation or to multiple thresholds so that multiple bits may be recorded in each memory cell.

For faster read performance, multiple cells, such as two cells, may be used per bit, with each cell programmed differently (one cell programmed high and the other cell programmed low for a 1, and vice-versa for a 0). On a read, the stored value can be determined by sensing the two cells differentially. Other arrangements can be used. Note that these various SLC, MLC, and ½-bit per cell arrangements, as well as other storage arrangements, also apply to the other embodiments presented herein.

Figure 9:
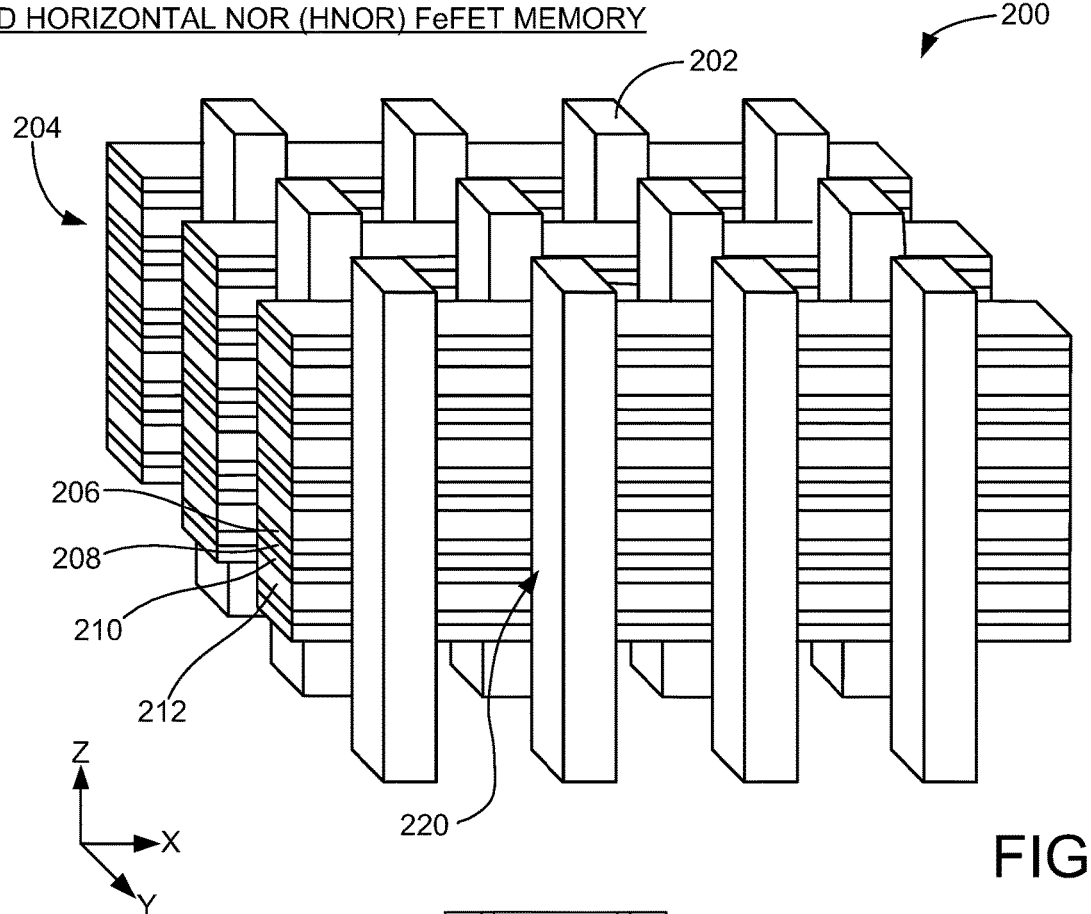
FIG. 9 is a 3D isometric depiction of a horizontal NOR (HNOR) FeFET memory in accordance with some embodiments.

FIG. 9 shows an isometric schematic depiction of another memory 200 constructed and operated in accordance with some embodiments as the buffer memory from FIG. 5. The memory 200 in FIG. 9 is characterized as a three-dimensional (3D) horizontal NOR (HNOR) FeFET memory array. This arrangement is suitable as a NOR flash replacement, as well as in other applications, and can be readily fabricated using existing processes (as modified herein) well known to those skilled in the art. A cross-sectional view of one of the FeFETs in FIG. 9 is provided in FIG. 10.

Elements in the memory 200 shown in FIG. 9 include vertically extending layers 202 configured to operate as word lines. A number of stacks 204 are coupled between adjacent sets of the vertical layers 202. Each stack includes respective, multiple sets of drain layers 206, bit lines 208, source layers 210, and channel/isolation layers 212. FeFETs 220 are located at the conjunction of each vertically extending layer and each horizontally extending set of layers, as indicated by arrow 220.

Figure 10:
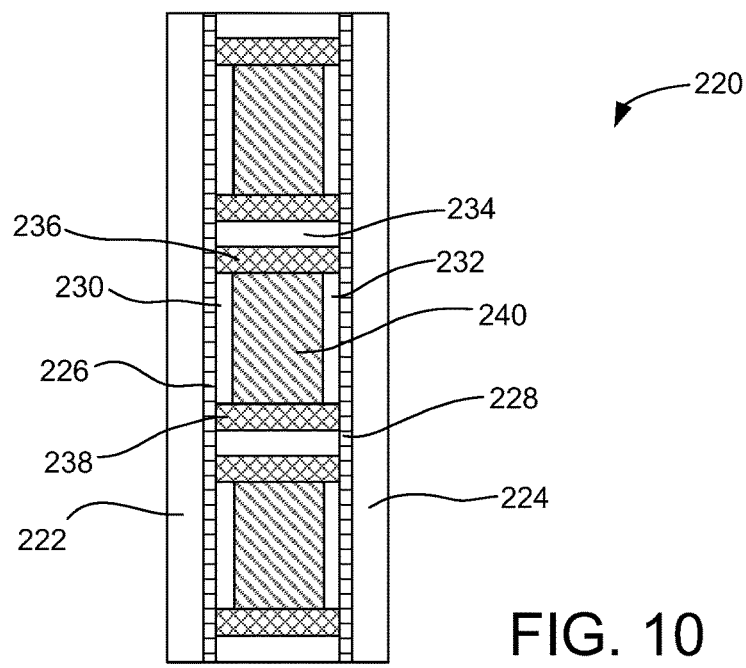
FIG. 10 is a cross-sectional representation of a selected FeFET from FIG. 9.

FIG. 10 shows a number of stacked FeFETs 220 from FIG. 9. Depicted regions include a left-side word line 222; a right-side word line 224; ferroelectric layers 226, 228; a left-side channel 230; a right-side channel 232; bit, source and drain lines 234, 236, 238; and interior isolation regions 240.

An exemplary fabrication process to form the memory 200 of FIGS. 9-10 can be as follows. First, CMOS peripheral circuitry (decoders, sense amps, etc.) are fabricated on an underlying wafer. Repeating layers of N+, P−, N+ polysilicon and optionally metal (e.g., W) bit lines are deposited. The N+ layers form the sources and drains of the memory cell transistors, while the edges of the P− layers form the channels. The metal reduces the bit line resistance and consequently the RC delay associated with the bit line, thus reducing the latency.

Stacks of bit lines are separated by etching vertically down to the substrate. The transistor gates are deposited conformally (e.g., via atomic layer deposition (ALD)). In the prior art, the gate structure was, e.g., a charge trap layer (ONO). In this embodiment, a conformally-deposited ferroelectric layer is used instead. A variety of materials and structures may be used for the ferroelectric film. By way of example, an 8 nm layer of $Hf0.5Zr0.5O2$ may be used.

After the ferroelectric film is deposited, metal gates and word lines are deposited and patterned. The metal may be chosen to produce the appropriate crystalline texture to promote the formation of the ferroelectric orthorhombic phase of $HfO2$ and related ferroelectrics. These materials include, but are not limited to, TiN, Pt, Ag, CrRu, CrMo, CrW, CrTi, and RuAl. A subsequent annealing step may be necessary to develop the appropriate crystal structure in the ferroelectric layers.

Programming of the respective FeFETs 220 can be accomplished by applying a positive programming voltage pulse (e.g., +10V) to the word line of the selected transistor while holding the source and drain (bit line) of the selected transistor at 0 V. The bit lines of the unselected transistors are held at an intermediate inhibit voltage (e.g., +5V) to prevent them from being written. An erase operation simply reverses the program operation, either with a negative voltage (e.g., −10V) applied to the gate while holding the source and drain at 0, or with a positive voltage (e.g., +10V) applied simultaneously to the source and drain while the gate is grounded. In either erase scheme, appropriate inhibit voltages must again be applied to the unselected transistors to prevent their state from being disturbed.

Reading a memory cell is accomplished by applying a small, positive voltage (e.g., +0.5 V) to the drain and holding the source at 0V while a small voltage (e.g., 2 V) may be applied to the gate of the selected transistor as well. To prevent other cells sharing bit lines with the selected cell from also being read, the gates of these cells are held at 0 V by grounding their word lines. The state of the memory cell is determined by measuring the current flowing through the selected cell, e.g., with sense amplifiers and other peripheral CMOS circuitry familiar to one of ordinary skill in the art.

From the foregoing it will be recognized that the buffer memory from FIG. 5 can be formed of FeFETs in substantially any desired 2D or 3D orientation. As noted above, an advantage of FeFET fabrication is that traditional deposition methods can be utilized to incorporate the FeFETs into any desired integration architecture.

Figures 11A, 11B:
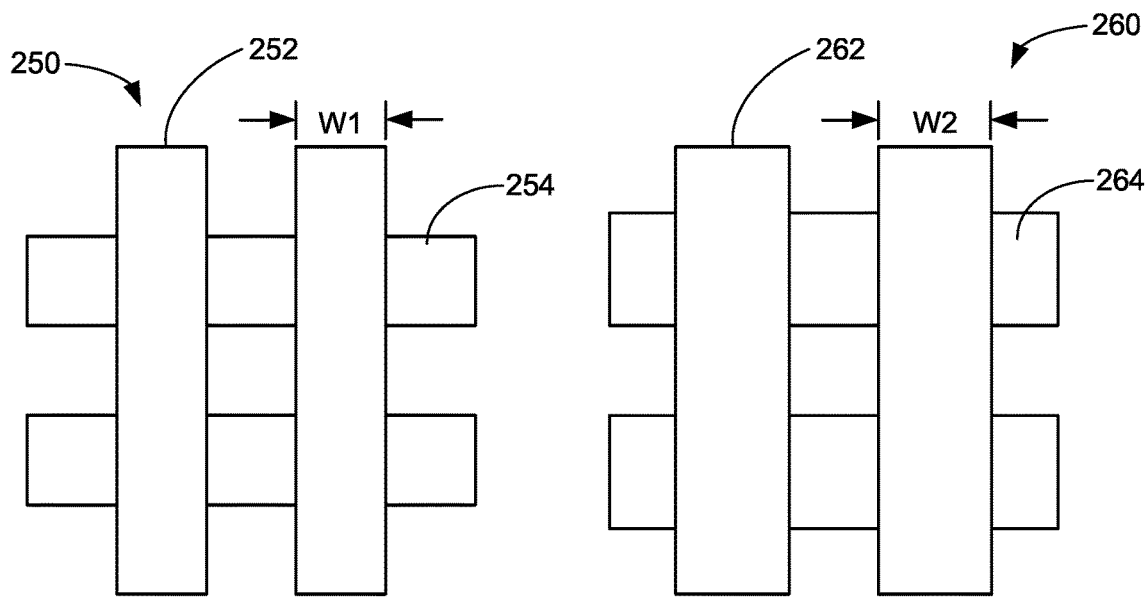
FIGS. 11A and 11B are simplified layouts of portions of a FeFET memory having different control line geometries in accordance with some embodiments.

FIGS. 11A and 11B show different portions of architectures with different aspect ratios with regard to control lines used to interconnect the respective FeFETs and other control aspects of the buffer memory. It will be appreciated that these can be readily applied to both 2D and 3D architectures.

FIG. 11A provides a portion of a memory 250 having first control lines 252 extending in a first direction (e.g., x, y, z) and second control lines 254 extending in a different, second direction (e.g., x, y, z), where the second direction is orthogonal to the first direction. Each of the respective control lines 252, 254 has a first width W1.

FIG. 11B shows a portion of another FeFET based memory 262 with corresponding orthogonally arranged control lines 264, 266 having a larger, second width W2. The larger width of the control lines in FIG. 11B will tend to provide reduced reactive effects upon data signals forwarded therealong. This will reduce inductive and capacitive delays in the transmission of data, potentially allowing the memory cells in FIG. 11B to have better (faster) transfer performance as compared to the memory cells in FIG. 11A.

In some embodiments, the buffer memory of FIG. 5 can be configured with larger (e.g., wider along any selected direction) control lines in some or all of the junctions of the FeFETs, as compared to other memory locations within the data storage device, in order to enhance data transfer performance. In further cases, a first portion of the buffer memory may be provided with a first size of control lines (e.g., FIG. 11A) and a second portion of the buffer memory may be provided with a larger, second size of control lines (e.g., FIG. 11B). The placement and retention of data within the buffer can be governed by a controller (such as the optimization controller) to place different sets of data within the buffer to achieve different performance rates.

Figure 12:
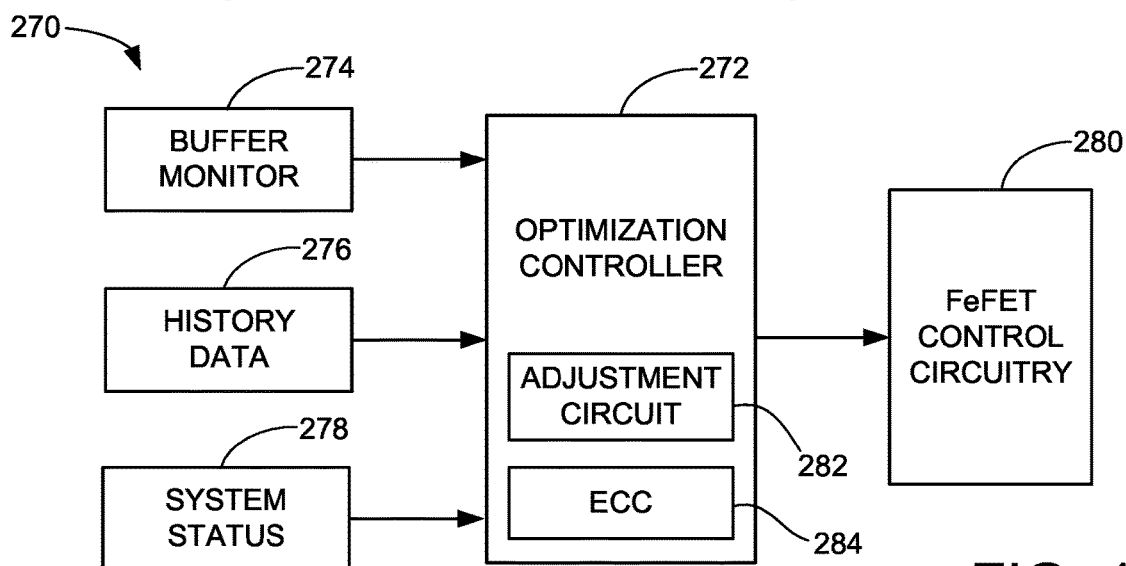
FIG. 12 is a functional block diagram of further aspects of the buffer memory of FIG. 5 in some embodiments.

FIG. 12 provides a functional block representation of another control circuit 270 that can be implemented in accordance with various embodiments, including as part of the data handling system 100 of FIG. 1, the SSD 110 of FIG. 2 and/or the buffer circuitry 160 of FIG. 5. The circuit 270 includes an optimization controller 272 which can correspond to the optimization controller 174 of FIG. 5. Inputs are provided to the controller 272 including from a buffer monitor 274, which can correspond to the monitor circuit 172; a history data block 276, which can represent a data structure stored in a memory location (e.g., controller memory 122 in FIG. 2) representative of history data accumulated by the monitor 274 and from other aspects of the system; and a system status block 276, which indicates various status states of the system during operation.

In response to these and other inputs (as required), the optimization controller 272 provides output commands to adjust the operational parameter settings of various aspects of FeFET control circuitry 278. The FeFET control circuitry 278 can include the various elements in FIG. 5 (e.g., the write driver, read driver, sense circuitry and refresh circuitry shown therein) as well as other aspects of the device, associated with the operation of the buffer memory. In this way, the operation of the FeFET memory 176 can be optimized in view of current state, historical data, system status, and other aspects of the operational environment.

The optimization controller 272 operates to adjust operation of the buffer over time in view of the respective inputs. In some cases, data aging can be a factor in determining adjustment to the buffer memory state. As noted above, one advantage of FeFET memory as compared to DRAM is the fact that DRAM has a very fast decay rate of the data stored in each of the memory cells. As a result, multiple read and refresh operations are usually carried out ever second to read and refresh the data stored in the respective DRAM cells.

While such refresh operations are not required in FeFETs, it has been observed that FeFET cells can tend to degrade over time. The decay rate is relatively slow, and may be measured in minutes, hours, days or weeks; nevertheless, over time it will be recognized that, the longer data are retained within a FeFET, the lower the effective polarization will become. Hence, in some embodiments the optimization controller 272 monitors the aging of the data stored in the buffer and, as required, applies a refresh or relocation operation to restore the data to a pristine state. Those skilled in the art will recognize that, by definition, a buffer tends to store data on a relatively short time frame. Nevertheless, it can be helpful for data retained on a more long term basis to be evaluated in this manner.

Another aspect of the operation of the optimization controller 272 is wear. It has been found that FeFETs provide significantly better wear characteristics as compared to other forms of solid state memory, such as flash. For example, a flash memory cell may experience wear after $10^4$ to $10^5$ program events, whereas an FeFET based memory cell may experience wear after $10^8$ to $10^{10}$ program events. These rates are merely exemplary, and other rates may be observed. It will be appreciated that a sufficient level of wear may be enough to cause a memory cell to no longer be able to reliably store data. A buffer, by definition, is likely to experience high levels of wear, including levels significantly higher than the associated main memory store NVM to which the data are being directed and from which the data are being retrieved. Accordingly, the optimization controller 272 can take steps to monitor wear and perform adaptive compensation, including wear leveling, adjustments in buffer utilization, use of other available memory locations, etc., to compensate for the wearing of the memory cells in the buffer.

Yet another aspect of the operation of the optimization controller 272 is based on indications of system status. As noted above, FeFET memory is non-volatile. This can be useful in situations in which the device (e.g., SSD 110) is transitioned from an operational mode to a deactivated mode such as during a power down event. Control information used by the device can be retained in the FeFET memory so that, once the device is subsequently reinitiated (e.g., transitioned from the deactivated mode back to the operational mode during a power up event), the control information is loaded and available for use by the system. In this way, faster time to ready (TTR) performance can be achieved.

At the same time, it may be desirable that other forms of data not be retained in the FeFET memory during such a power cycle event. This can include cached data, cryptographic data, etc. In this case, the optimization controller 272 can be configured to perform a read operation upon locations within the FeFET buffer memory as part of the shutdown (scram) processing. Because FeFETs can be read destructive, the reading of the data, without a subsequent refresh operation, essentially wipes the data from the memory. In some cases, the optimization controller 272 can utilize inputs from the system status block 278 to selectively wipe or retain contents of the buffer memory. This operation can take place during deinitialization operations, as well as at other appropriate times during device operation. However, in cases where the FeFETs are not read destructive, a similar wipe operation can take place by simply writing all of the FeFETs with a selected value, such as all zeros or all ones, or random data. Because FeFETs are rewritable, it is relatively easy to wipe the memory, particularly if the FeFETs are arranged to accommodate fast response characteristics. It will be noted that a read operation carried out to wipe the memory jettisons the data (e.g., the read data from the FeFETs is not retained elsewhere in another non-volatile memory, so the read data are lost).

Accordingly, any number of different characteristics of the buffer memory can be monitored by the monitor circuit, including but not limited to BER, data aging, wear, frequency of access, read/write counts, hotness or coldness of data relative to other accesses of other data sets, power down detections, types of data stored, etc. In response, any number of different parameters can be adjusted by the optimization controller circuit, including the relocation of data (e.g., reading data out and writing the data back to the buffer memory, either to the same location or a different location), the duplication of data in the memory in a second location in the buffer memory or in another, separate memory device, the adjustments of error correction encoding schemes to strengthen (or weaken) the data recovery capabilities of the system (e.g., addition of parity values, different forms of ECC, etc.), adjustments to read and/or write voltages/currents/power levels applied to program and/or recover data; changes in frequency at which the data are read and refreshed, and so on. Other types of monitored characteristics and operational parameters that can be monitored and adjusted will readily occur to the skilled artisan in view of the present disclosure and are fully contemplated and covered by the disclosure.

To this end, the optimization controller circuit 272 in FIG. 12 is shown to include an adjustment circuit 282 and an ECC (error correction code) circuit 284. The adjustment circuit 282 operates as described herein to implement adjustments to the operation of the memory buffer via the FeFET control circuitry 280. The ECC circuit 284 generates the necessary ECC values (e.g., parity, LDPC, Reed Solomon, XOR, checksums, etc.) to enhance the protection of the data stored in the buffer memory.

Figure 13:
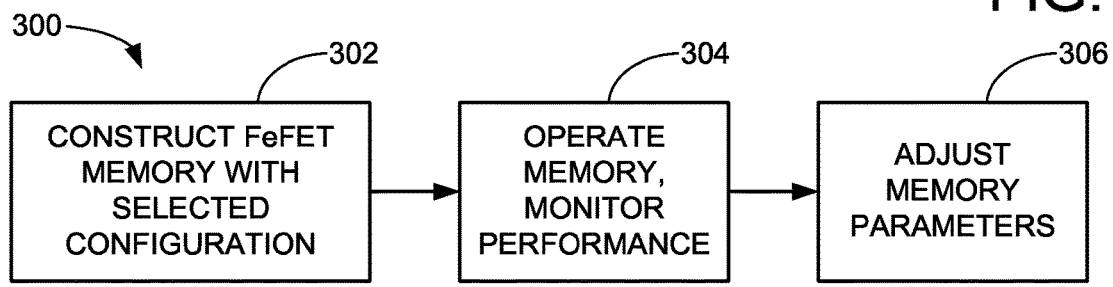
FIG. 13 is a sequence diagram illustrating construction and use of a front end buffer memory in accordance with various embodiments.

FIG. 13 is a sequence diagram for an operation sequence 300 involving a FeFET based buffer memory in accordance with various embodiments. At step 302, a FeFET buffer memory is initially constructed having a selected configuration. This can include selection of various configuration characteristics described herein, including 2D or 3D arrangements, the size and spacings of control lines, the embedding of the memory into a controller SOC, etc. It is contemplated that the configuration will be selected to match the desired performance characteristics for the memory.

The memory is thereafter deployed and operated at step 304. This will include monitoring of the performance of the memory, including but not limited to monitoring for aging and wear characteristics. Based on these and other monitored states, various memory parameters are adjusted at step 306. This can include adjustments in refresh rates, relocation of data, wear leveling, etc.

FIGS. 14A through 14D show different gate constructions for various FeFETs in accordance with further embodiments. Because of the operational environment of a front end buffer, it may be desirable to trade off certain characteristics of the FeFETs, such as data retention, for other characteristics, such as speed. As such, while FeFETs can be configured to store data at the same rate as a flash memory cell (e.g., 1 year, 5 years, 10 years, etc.), in some cases it may make sense to configure the FeFETs for the front end buffer environment to only store data for a relatively short period of time, such as measured in minutes, hours or days. Refresh operations can be carried out as required to retain the data, but by definition, a front end buffer is not likely going to be used to retain data for an extended period of time.

Figure 14A:
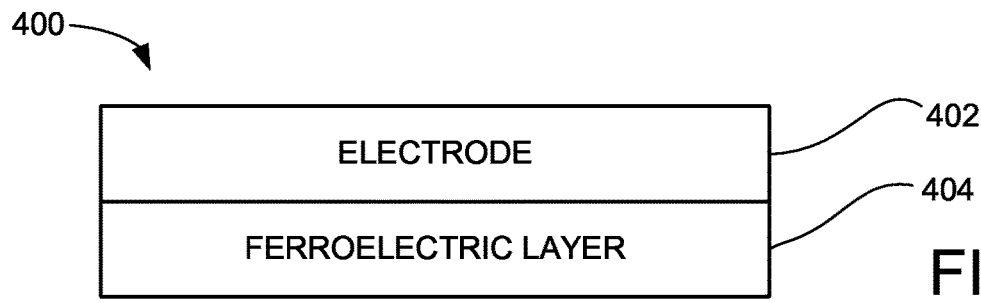
FIGS. 14A-14D show different alternate constructions for the gate structure of an FeFET in accordance with further embodiments.

FIG. 14A accordingly shows a first construction for a gate structure 400 in some embodiments. The gate structure 400 can be incorporated into an FeFET as shown above in FIG. 3A. In this example, the gate structure 400 includes an electrically conductive electrode layer 402 and a ferroelectric layer 404. Data bit(s) are stored in relation to the electrical polarization of the layer 404. Generally, the thinner the layer 404, the faster the transitioning and reading response (but the shorter the retention period). Hence, different thicknesses of the layer 404 can be selected to tune the memory for a given application.

Figure 14B:
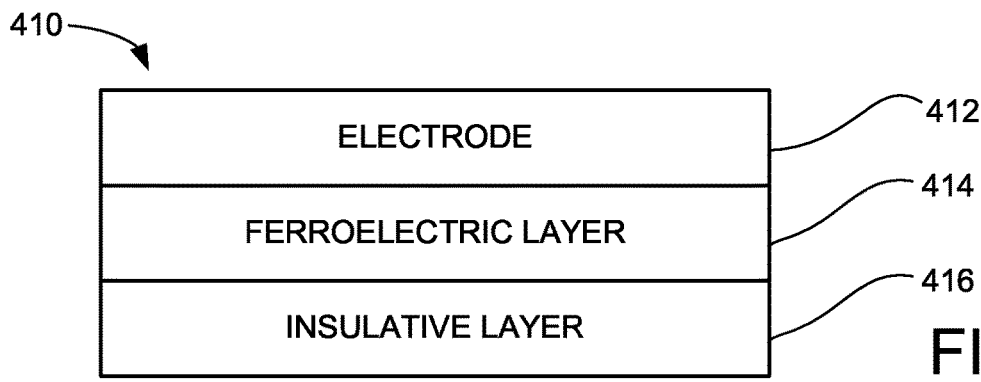

FIG. 14B shows another construction for a gate structure 410. The structure in FIG. 14B includes an electrode layer 412, a ferroelectric layer 414 and an insulative layer 416. This can provide a number of advantages, including better separation between the respective polarization states.

Figure 14C:
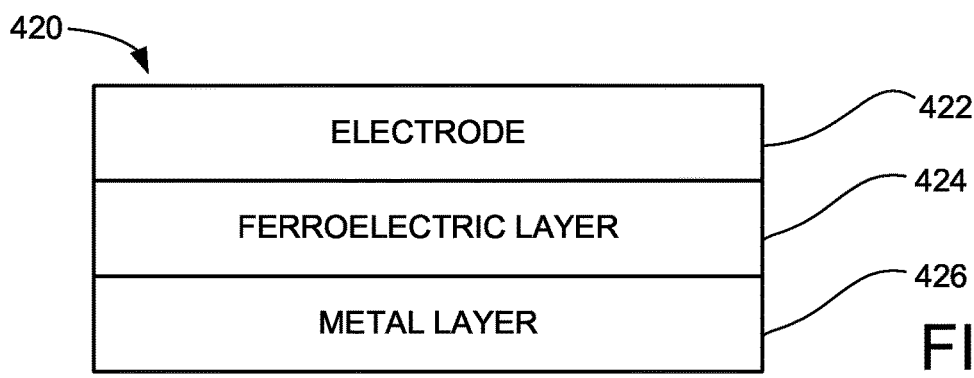

FIG. 14C provides yet another construction for a gate structure 420. This construction includes an electrode layer 422, a ferroelectric layer 424 and a metal layer 426.

Figure 14D:
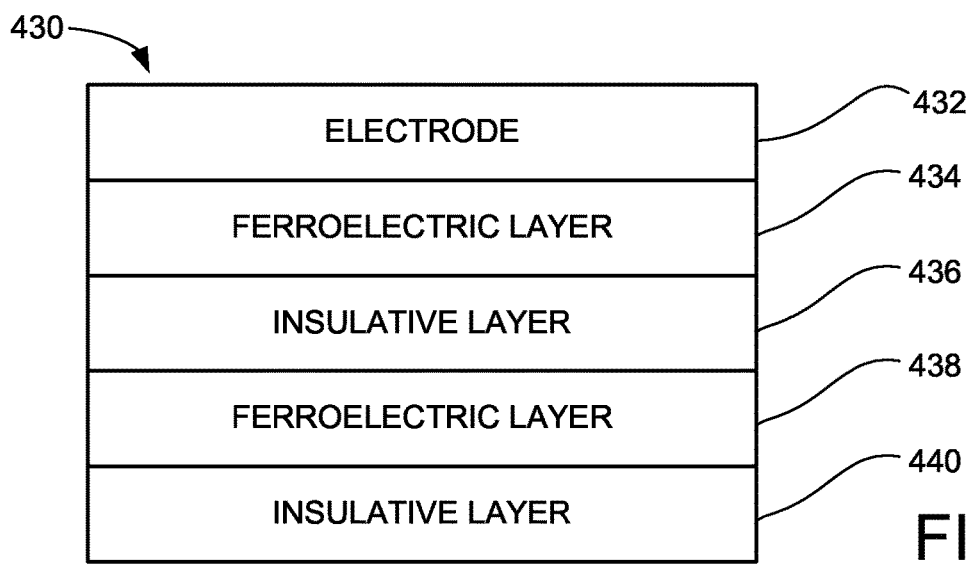

FIG. 14D shows still another construction for a gate structure 430. This is a laminated construction with an electrode layer 432, a first ferroelectric layer 434, a first insulative layer 434, a second ferroelectric layer 438, and a second insulative layer 440. Additional pairs of ferroelectric and insulative layers can be incorporated as desired. Also, metal layers such as shown in FIG. 14C can be used. These and other alternatives can be used to tune the FeFETs in the buffer memory to achieve desired combinations of program reliability, speed, retention, and so on.

It will now be appreciated that the various embodiments of the present disclosure provide a number of benefits over the existing art. The use of ferroelectric layers and structures in a number of novel FeFET arrangements as disclosed herein can provide numerous cost effective, compact and fast performance memory applications. Some embodiments have been presented in the context of a DRAM substitute, so that the various memory arrays could be readily incorporated into an existing SOC (system on chip), ASIC (application specific integrated circuit) or other integrated application to provide local fast and reliable memory for a processor.

However, the present disclosure is not so limited; the skilled artisan will immediately recognize that the various structures provided have numerous other valuable applications for any number of other environments. Such environments include, but are not limited to, main memory for a data storage device (e.g., as a replacement for NOR or NAND flash in an SSD or hybrid data storage device), a data cache, a RAID controller storage space, a mass storage environment, a cloud computing environment, an edge computing environment, a portable USB storage device, an IoT device, local memory for a portable storage device (e.g., smart phone, tablet, laptop), etc.

The terms "horizontal" and "vertical" as used herein will be understood as relative terms with regard to relative orthogonality and do not necessarily require absolute orientation with respect to the center of the earth. Accordingly, horizontal and vertical elements can be oriented in any respective orientations so long as the respective elements are nominally orthogonal to one another in the context in which these terms are used.

It is to be understood that even though numerous characteristics and advantages of various embodiments of the present disclosure have been set forth in the foregoing description, this description is illustrative only, and changes may be made in detail, especially in matters of structure and arrangements of parts within the principles of the present disclosure to the full extent indicated by the broad general meaning of the terms wherein the appended claims are expressed.

What is claimed is:

1. A data storage device, comprising:
a non-volatile memory (NVM) arranged as a main store for user data;
a controller configured to transfer the user data between the NVM and an external client (host);
a buffer memory formed of ferroelectric field effect transistors (FeFETs) arranged as a temporary storage location to store the user data and control information during said transfers by the controller, the controller comprising a monitor circuit configured to monitor operation of the FeFETs during said transfers and an optimization circuit configured to adjust at least one operational parameter associated with the FeFETs responsive to the monitored operation by the monitor circuit,
wherein the NVM comprises control lines having a first width, and wherein the FeFETs in the buffer memory have a control lines with a second width, the second width being larger than the first width; and
wherein the monitored operation by the monitor circuit comprises determination of data aping of data stored to the FeFETs, and the at least one operational parameter adjusted by the optimization circuit comprises the data aping of data stored to the FeFETs.

2. The data storage device of claim 1, wherein the monitored operation by the monitor circuit comprises determination of a bit error rate (BER) of data transferred to or from the buffer memory.

3. The data storage device of claim 1, wherein the monitored operation by the monitor circuit comprises determination of wear of the FeFETs responsive to a write count associated with total accumulated number of data programming operations upon the FeFETs.

4. The data storage device of claim 1, wherein the at least one parameter adjusted by the optimization circuit comprises at least a selected one of an adjusted error correction code (ECC) value, an adjustment of a voltage or current value applied to the FeFETs, or a refresh operation in which data are read out of the buffer memory and written back to the buffer memory.

5. The data storage device of claim 1, wherein the FeFETs each comprise a gate structure disposed between doped source and drain regions, each gate structure comprising a layer of ferroelectric material disposed between a tunneling barrier layer and a conductive electrode layer.

6. The data storage device of claim 5, wherein the ferroelectric layer comprises at least a selected one of $HfO_2$, $ZrO_2$, or $Hf_{1-x}Z_xO_2$.

7. The data storage device of claim 5, wherein the tunneling barrier layer comprises at least a selected one of $Al_2O_3$, MgO, or $SrTiO_3$.

8. The data storage device of claim 1, wherein each FeFET is configured to store multiple bits of data.

9. The data storage device of claim 1, wherein each FeFET is configured to store less than a full bit of data.

10. The data storage device of claim 1, wherein the memory is characterized as a 3D vertical gate (VG) NAND ferroelectric field effect transistor (FeFET) memory, the memory arranged as a plurality of vertically extending, planar gate structures intersected by a plurality of horizontally extending access control lines, wherein at least one FeFET is arranged at each intersection of the horizontally extending control lines and the vertically extending planar gate structures.

11. The data storage device of claim 1, wherein the memory is characterized as a 3D horizontal NOR (HNOR) ferroelectric field effect transistor (FeFET) memory, the memory arranged as a plurality of vertically extending layers configured to operate as word lines, a plurality of stacks of layers between adjacent pairs of the vertically extending layers, and a plurality of FeFETs at each connecting interface between an associated word line and an associated stack.

12. The data storage device of claim 1, wherein a first portion of the FeFETs in the buffer memory are interconnected using control lines having a first overall width, and wherein a second portion of the FeFEts in the buffer memory are interconnected using control lines having a larger, second overall width.

13. An apparatus comprising:
a buffer memory formed of ferroelectric field effect transistors (FeFETs);
a program driver configured to write data to the FeFETs to store an existing pattern to the FeFETs;
a read driver configured to read data from the FeFETs to read the existing pattern from the FeFETs;
a refresh circuit configured to selectively rewrite the existing data pattern back to the FeFETs after a read operation carried out by the read driver;
a sense circuit configured to sense the existing pattern stored to the FeFETs;
a monitor circuit configured to monitor operation of the FeFETs;
an optimization controller configured to adjust at least one operational parameter associated with the FeFETs responsive to the monitored operation by the monitor circuit;
a non-volatile memory (NVM) arranged as a main store for user data, wherein the NVM comprises control lines having a first width, and wherein the FeFETs in the buffer memory have a control lines with a second width, the second width being larger than the first width; and
wherein the monitored operation by the monitor circuit comprises at least a selected one of a bit error rate (BER) associated with the transfers of data to and from the buffer, data aging of an existing data pattern stored to the FeFETs or a write count associated with total accumulated number of data programming operations upon the FeFETs by the program driver.

14. The apparatus of claim 13, wherein, responsive to receipt of a power down signal indicative of a power down event, the read driver performs a read operation to read the existing data pattern from the FeFETs and the refresh circuit is directed to not perform a refresh operation to rewrite the existing data pattern back to the FeFETs.

15. The apparatus of claim 13, wherein the at least one parameter adjusted by the optimization controller comprises at least a selected one of an adjusted error correction code (ECC) value, an adjustment of a voltage or current value applied to the FeFETs during a read or write operation, or a refresh operation in which data are read out of the buffer memory from a first location therein and written back to the buffer memory in a different, second location therein.

16. The apparatus of claim 13, wherein the FeFETs each comprise a gate structure disposed between doped source and drain regions, each gate structure comprising a layer of ferroelectric material disposed between a tunneling barrier layer and a conductive electrode layer, wherein the ferroelectric layer comprises at least a selected one of $HfO_2$, $ZrO_2$, or $Hf_{1-x}Z_xO_2$, and wherein the tunneling barrier layer comprises at least a selected one of $Al_2O_3$, MgO, or $SrTiO_3$.

17. The apparatus of claim 13, wherein the non-volatile memory (NVM) is coupled to the buffer memory, and wherein the optimization controller further operates to transfer data between the buffer memory and the NVM.

* * * * *